(12) United States Patent
Nemoto et al.

(10) Patent No.: US 12,176,418 B2
(45) Date of Patent: Dec. 24, 2024

(54) SEMICONDUCTOR DEVICE THAT INCLUDES AT LEAST FOUR SEMICONDUCTOR REGIONS

(71) Applicant: Kabushiki Kaisha Toshiba, Tokyo (JP)

(72) Inventors: Hiroki Nemoto, Fuchu (JP); Yusuke Kobayashi, Yokohama (JP); Tomoaki Inokuchi, Yokohama (JP); Hiro Gangi, Ota (JP); Tatsuo Shimizu, Shinagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 370 days.

(21) Appl. No.: 17/651,606

(22) Filed: Feb. 18, 2022

(65) Prior Publication Data

US 2023/0085364 A1   Mar. 16, 2023

(30) Foreign Application Priority Data

Sep. 15, 2021   (JP) ................... 2021-150191

(51) Int. Cl.
| | |
|---|---|
| *H01L 29/66* | (2006.01) |
| *H01L 29/40* | (2006.01) |
| *H01L 29/423* | (2006.01) |
| *H01L 29/78* | (2006.01) |

(52) U.S. Cl.
CPC ...... *H01L 29/66734* (2013.01); *H01L 29/404* (2013.01); *H01L 29/407* (2013.01); *H01L 29/4236* (2013.01); *H01L 29/7813* (2013.01)

(58) Field of Classification Search
CPC ............. H01L 29/66734; H01L 29/404; H01L 29/407; H01L 29/4236; H01L 29/7813; H01L 29/1095; H01L 29/0696; H01L 29/7805
USPC ........................................................ 438/270
See application file for complete search history.

(56) References Cited

U.S. PATENT DOCUMENTS

| | | | |
|---|---|---|---|
| 9,525,059 B1 | 12/2016 | Kobayashi | |
| 2017/0222038 A1* | 8/2017 | Katou | ................. H01L 29/7811 |

FOREIGN PATENT DOCUMENTS

| | | |
|---|---|---|
| JP | 8-264772 A | 10/1996 |
| JP | 2017-55016 A | 3/2017 |
| JP | 2017-139262 A | 8/2017 |
| JP | 2019-9428 A | 1/2019 |

* cited by examiner

*Primary Examiner* — Mohammad M Hoque
(74) *Attorney, Agent, or Firm* — Oblon, McClelland, Maier & Neustadt, L.L.P.

(57) ABSTRACT

A semiconductor device includes a first electrode, a second electrode, a first semiconductor region of a first conductivity type including a first portion and a second portion, a second semiconductor layer of a second conductivity type, a third semiconductor region of the first conductivity type, a fourth semiconductor region of the second conductivity type, a gate electrode located between the second semiconductor region and the fourth semiconductor region and between the third semiconductor region and the fourth semiconductor region in a second direction, a first insulating region, a third electrode, and a second insulating region.

6 Claims, 3 Drawing Sheets

SEMICONDUCTOR DEVICE THAT INCLUDES AT LEAST FOUR SEMICONDUCTOR REGIONS

CROSS-REFERENCE TO RELATED APPLICATIONS

This application is based upon and claims the benefit of priority from Japanese Patent Application No. 2021-150191, filed on Sep. 15, 2021, and the entire contents of which are incorporated herein by reference.

FIELD

Embodiments described herein relate generally to a semiconductor device.

BACKGROUND

In a MOS field-effect transistor (MOSFET) having a trench gate structure, a low gate capacitance and a low on-resistance are required in order to realize low power consumption.

DETAILED DESCRIPTION

Figure 1:
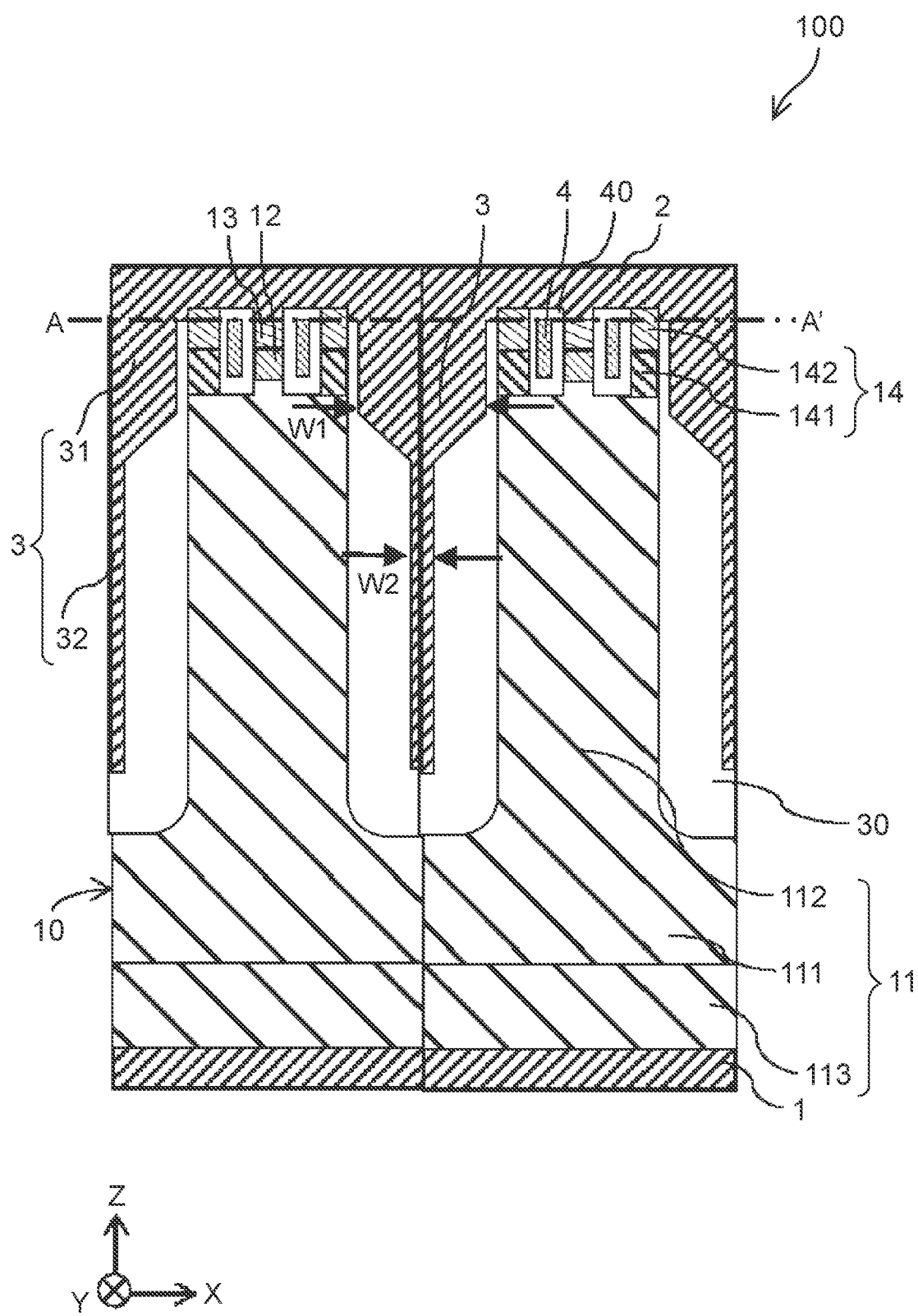
FIG. 1 is a schematic cross-sectional view of a semiconductor device according to a first embodiment, and is a cross-sectional view taken along line B-B' in FIG. 2.

Hereinafter, embodiments of the present invention will be described with reference to the drawings.

Parts denoted by the same reference numerals indicate the same parts.

Note that the drawings are schematic or conceptual, and the relationship between thicknesses and widths of each portion, a ratio coefficient of a size between the portions, and the like are not necessarily the same as actual ones.

In addition, even in the case of representing the same portion, dimensions and ratio coefficients may be represented differently from each other depending on the drawings.

First Embodiment

Figure 2:
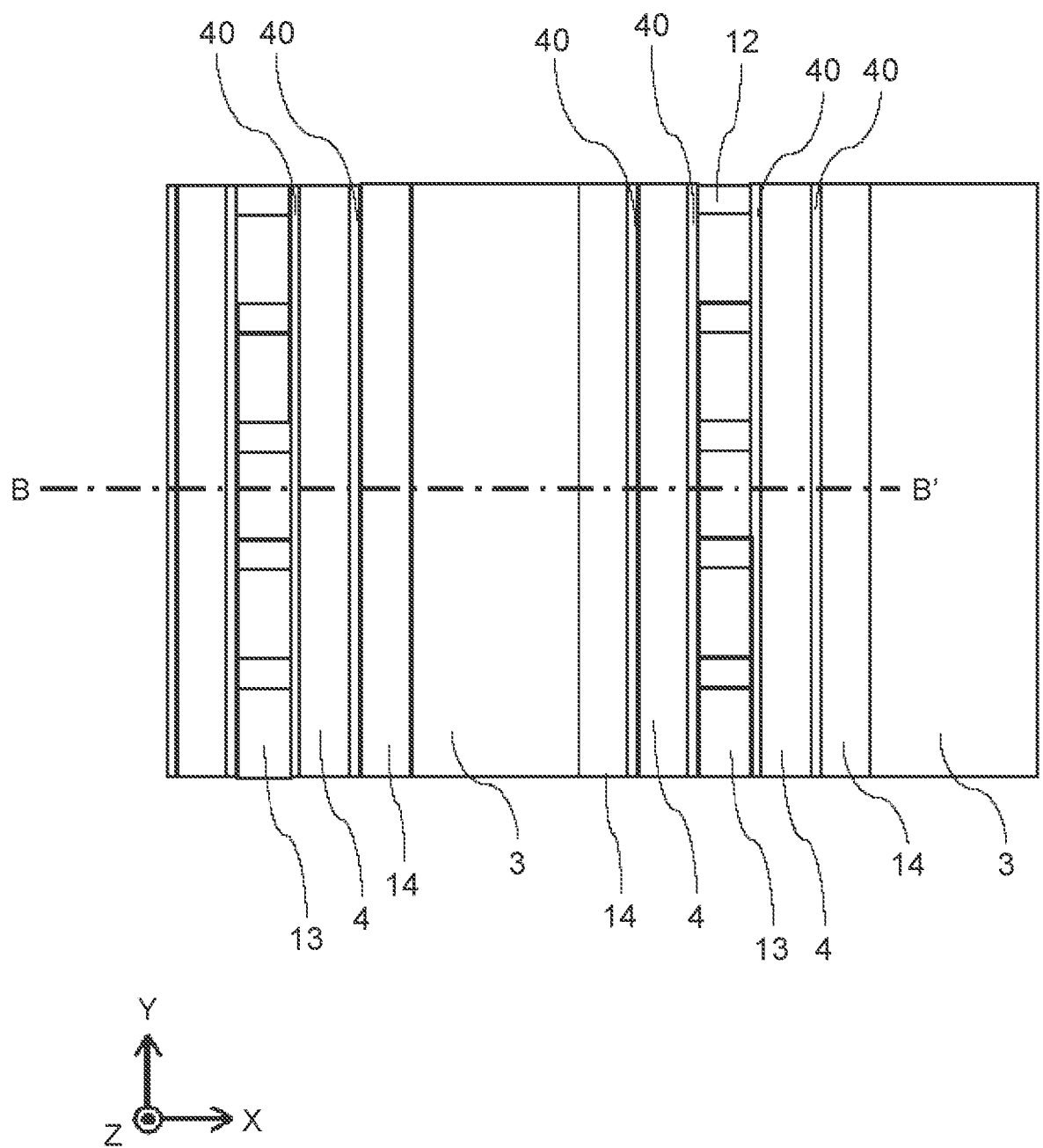
FIG. 2 is a schematic cross-sectional view of a semiconductor device according to the embodiment, and is a cross-sectional view taken along line A-A' in FIG. 1.

A configuration of a semiconductor device 100 according to a first embodiment will be described with reference to FIGS. 1 and 2. FIG. 1 is a cross-sectional view of a semiconductor device according to an embodiment, and illustrates a cross section taken along line B-B' of FIG. 2. FIG. 2 is a plan view of the semiconductor device according to the embodiment, and illustrates a cross section taken along line A-A' of FIG. 1.

The semiconductor device 100 is a MOS field-effect transistor (MOSFET). Hereinafter, a case where a first conductivity type is an N type and a second conductivity type is a P type will be described as an example. The semiconductor device 100 includes a first electrode 1 (drain electrode), a second electrode 2 (source electrode), a third electrode 3 (field plate electrode), a gate electrode 4, a semiconductor layer 10, a first insulating region 40 (gate insulating film), and a second insulating region 30 (field plate insulating film). The semiconductor layer 10 includes a first semiconductor region 11 of a first conductivity type (N), a second semiconductor region 12 of a second conductivity type (P), a third semiconductor region 13 of a first conductivity type (N+), and a fourth semiconductor region 14 of the second conductivity type (P).

Here, a direction from the first electrode 1 toward the second electrode 2 is defined as a Z direction (first direction), a direction intersecting the Z direction is defined as an X direction (second direction), and a direction intersecting the X direction and the Z direction is defined as a Y direction. "Intersecting directions" means that the directions are not parallel, and for example, the directions are orthogonal to each other.

The first electrode 1 is, for example, a drain electrode. The second electrode 2 is, for example, a source electrode. The first electrode 1 and the second electrode 2 extend in the X direction and the Y direction. Examples of the material of the first electrode 1 and the material of the second electrode 2 include metals containing at least one selected from the group of aluminum (Al), titanium (Ti), nickel (Ni), tungsten (W), gold (Au), and the like.

The semiconductor layer 10 is located between the first electrode 1 and the second electrode 2 in the Z direction. The semiconductor layer 10 extends in the X direction and the Y direction. Examples of the main component of the semiconductor layer 10 include silicon (Si), silicon carbide (SiC), gallium nitride (GaN), or the like.

The semiconductor layer 10 includes semiconductor regions of the first conductivity type (N) and the second conductivity type (P). As the N-type conductivity type impurity element contained in the semiconductor layer 10 is, for example, phosphorus (P), arsenic (As), or the like is applied. As a P-type conductivity type impurity element contained in the semiconductor layer 10, for example, boron (B) or the like is applied.

The first semiconductor region 11 functions as a drain of the semiconductor device 100. The first semiconductor region 11 is in contact with the first electrode 1. The first semiconductor region 11 includes a first portion 111, a plurality of second portions 112, and a third portion 113 which is a substrate region. The first portion 111 is located between the first electrode 1 and the second electrode 2 in the Z direction, and is electrically connected to the first electrode 1. The plurality of second portions 112 are separated from each other in the X direction. The second portion 112 extends in the Y direction. The second portion 112 is located between the first electrode 1 and the second electrode 2 in the Z direction, and extends from the first portion 111 toward the second electrode 2. The third portion 113 is located between the first electrode 1 and the first portion 111 in the Z direction. The third portion 113 is connected to the first electrode 1. The third portion 113 is, for example, a silicon substrate extending in the X direction and the Y direction and containing an N-type impurity. The N-type impurity concentration included in the third portion 113 is higher than the N-type impurity concentration included in the first portion 111 and the second portion 112. The first portion 111 extends in the X direction and the Y direction. The first semiconductor region 11 may be configured not to include the third portion 113 by bringing the first portion 111 into contact with the first electrode 1.

The P-type second semiconductor region 12 functions as a channel of the semiconductor device 100. The second semiconductor region 12 contains P-type impurities. The second semiconductor region 12 is on a part of the second portion 112 in the Z direction. In other words, the second semiconductor region 12 is located between the second portion 112 and the second electrode 2 in the Z direction. The second semiconductor region 12 extends in the Y direction. In FIG. 1, the third semiconductor region 13 is provided on a part of the second semiconductor region 12, but as illustrated in FIG. 2, the third semiconductor region 13 is not provided on a part of the second semiconductor region 12, and is electrically connected to the second electrode 2.

The N+ type third semiconductor region 13 functions as a source of the semiconductor device 100. The third semiconductor region 13 contains N-type impurities. The N-type impurity concentration included in the third semiconductor region 13 is higher than the N-type impurity concentration included in the first portion 111 and the second portion 112 of the first semiconductor region 11. The third semiconductor region 13 is on a part of the second semiconductor region 12 in the Z direction. In other words, the third semiconductor region 13 is located between a part of the second semiconductor region 12 and the second electrode 2. The plurality of third semiconductor regions 13 are arranged along the Y direction. The third semiconductor region 13 and the second electrode 2 are electrically connected.

The plurality of fourth semiconductor regions 14 function as source contacts (source electrode contacts). The fourth semiconductor region 14 is located between a part of the second portion 112 and the second electrode in the Z direction. Two fourth regions 14 separated in the X direction are provided with respect to one second portion 112. The second semiconductor region 12 and the third semiconductor region 13 are located between the two fourth semiconductor regions 14. The fourth semiconductor region 14 is located between a part of the second portion 112 and the second electrode 2. The fourth semiconductor region 14 extends in the Y direction.

The fourth semiconductor region 14 may include a fourth portion 141 and a fifth portion 142 having different P-type impurity concentrations. The fourth portion 141 is in contact with the first semiconductor region 11. The fifth portion 142 has a P-type impurity concentration higher than that of the fourth portion 141, and is electrically connected to the second electrode 2.

The third electrode 3 functions as a field plate electrode. The third electrode 3 is located between the first portion 111 of the first semiconductor region 11 and the second electrode 2 in the Z direction. The third electrode 3 is connected to the second electrode 2 and extends from the second electrode 2 toward the first electrode 1 in the Z direction. The third electrode 3 also extends in the Y direction. The third electrode 3 has a first electrode portion 31 and a second electrode portion 32.

The first electrode portion 31 is connected to the second electrode 2. The first electrode portion 31 is located across a region between the second portions 112 adjacent to each other and a region between the fourth semiconductor regions 14 adjacent to each other in the X direction. The first electrode portion 31 faces the second portion 112 and the fourth semiconductor region 14 via the second insulating region 30 in the X direction. The first electrode portion 31 has a length of a first width W1 in the X direction. The first electrode portion 31 is in contact with a part of the fourth semiconductor region 14 in the X direction.

The second electrode portion 32 is located between the first portion 111 and the first electrode portion 31 in the Z direction. The second electrode portion 32 is located between the second portions 112 adjacent to each other in the X direction. The second electrode portion 32 faces the first portion 111 and the second portion 112 via the second insulating region 30 in the X direction and the Z direction. The second electrode portion 32 has a length of a second width W2 shorter than the first width W1 in the X direction.

The second insulating region 30 functions as a field plate insulating film. The second insulating region 30 is located between the third electrode 3 and the first semiconductor region 11 and the fourth semiconductor region 14. The second insulating region 30 contains an insulating material and electrically separates the third electrode 3 from the first semiconductor region 11. The second insulating region 30 extends in the Y direction.

The gate electrode 4 is located between the second portion 112 of the first semiconductor region 11 and the second electrode 2 in the Z direction. The gate electrode 4 is located across a region between the second semiconductor region 12 and the fourth semiconductor region 14 adjacent to each other in the X direction and a region between the third semiconductor region 13 and the fourth semiconductor region 14 adjacent to each other in the X direction. The gate electrode 4 faces the second semiconductor region 12, the third semiconductor region 13, and the fourth semiconductor region 14 via the first insulating region 40 in the X direction.

The first insulating region 40 functions as a gate insulating film. The first insulating region 40 is located between the gate electrode 4 and the second electrode 2, the first semiconductor region 11, the second semiconductor region 12, the third semiconductor region 13, and the fourth semiconductor region 14. The first insulating region 40 includes an insulating material and electrically separates the gate electrode 4 from the second electrode 2, the first semiconductor region 11, the second semiconductor region 12, the third semiconductor region 13, and the fourth semiconductor region 14.

In the X direction, the third electrode 3 and the gate electrode 4 are separated from each other. On the XY plane, the first insulating region 40, the second insulating region 30, and the semiconductor region 10 are located between the third electrode 3 and the gate electrode 4.

In the X direction, the two fourth semiconductor regions 14 are located between the two adjacent third electrodes 3. In the X direction, two gate electrodes are located between the two fourth semiconductor regions 14. In the X direction, the second semiconductor region 12 and the third semiconductor region 13 are located between the two gate electrodes 4. In the X direction, the gate electrode 4 and the fourth semiconductor region 14 are located between the second semiconductor region 12 and the third electrode 3.

A method for manufacturing the semiconductor device 100 will be described. A formation timing of each semiconductor layer and a formation timing of the electrode can be interchanged.

An N+ semiconductor substrate is prepared. A semiconductor layer containing an N-type impurity concentration is epitaxially grown on the N+ semiconductor substrate to form the first semiconductor region 11.

An oxide film is deposited on the first semiconductor region 11, opened by photolithography, and a trench is formed by dry etching. An oxide film (second insulating region 30) is formed on a sidewall and a bottom portion of the trench by heat treatment, and polysilicon (second electrode portion 32) is formed inside the trench. Excess oxide film and polysilicon remaining in an upper portion of the trench are removed by isotropic etching, and polysilicon is further filled to form the third electrode 3 and the second insulating region 30.

Lithography and ion implantation of impurities are performed on the first semiconductor region 11 to form the second semiconductor region 12, the third semiconductor region 13, and the fourth semiconductor region 14.

The trench is formed by removing a part of the semiconductor region 10 by the dry etching, an oxide film (first insulating region 40) is formed by thermal oxidation, and the oxide film is removed while leaving the inside of the trench. The polysilicon (gate electrode 4) is formed inside the trench, and the oxide film is further formed in an upper portion of the polysilicon.

The first electrode 1 and the second electrode 2 are formed. A gate pad (not illustrated) is connected to the gate electrode 4 via a gate contact (not illustrated) penetrating the first insulating region 40.

The semiconductor device 100 illustrated in FIG. 1 can be provided by the above-described manufacturing method.

The operation of the semiconductor device 100 will be described. The semiconductor device 100 operates when a potential is applied to the first electrode 1, the second electrode 2, and the gate electrode 4 from a power supply device and a drive device (not illustrated in FIGS. 1 and 2). Hereinafter, the potential applied to the second electrode 2 is set as a reference (0 V). A potential of 0 V is applied to the second electrode 2, and a positive potential, for example, 50 V is applied to the first electrode 1 in a turn off state. When the semiconductor device 100 is turned on, a potential higher than the threshold potential Vth is applied to the gate electrode 4. As a result, a channel is formed in the second semiconductor region 12, and a current flows from the first electrode 1 to the second electrode 2 through the first semiconductor region 11, the second semiconductor region 12, and the third semiconductor region 13.

When the semiconductor device 100 is turned off, a potential lower than the threshold potential Vth is applied to the gate electrode 4. No channel is formed in the second semiconductor region 12, and no current flows between the first electrode 1 and the second electrode 2.

When the semiconductor device 100 is turned off, an electric field due to a source-gate voltage is generated in the semiconductor region 10, particularly the second portion 112, located between the adjacent third electrodes 3. The concentration of the electric field contributes to destruction of the semiconductor region 10. Since a potential difference is generated between the first semiconductor region 11 and the second semiconductor region 12, particularly, a strong electric field is generated at the interface. The third electrode 3 extending from the second electrode 2 toward the first electrode 1 disperses an electric field applied to the second semiconductor region 12 and forms a depletion layer in the second portion 112, thereby improving the withstand voltage (breakdown voltage) of the semiconductor device 100.

In the semiconductor device 100, the semiconductor layer 10, the first insulating region 40, and the second insulating region 30 are located between the gate electrode 4 and the third electrode 3. Therefore, the capacitance between the gate electrode 4 and the third electrode 3 decreases, and the gate capacitance of the semiconductor device 100 decreases. In the semiconductor device 100, by providing the two gate electrodes 4 at a narrower interval than the trench in which the third electrode 3 is provided, the channel region (second semiconductor region 12) having a narrow width in the X direction can be formed. Since the second semiconductor region 12 has a narrow width in the X direction and is sandwiched between the two gate electrodes 4, the second semiconductor region receives a strong electric field control from the two gate electrodes 4. The withstand voltage of the semiconductor device 100 is improved. The second semiconductor region 12 can contain high-concentration impurities. The on-resistance of the semiconductor device 100 can be reduced.

Figure 3:
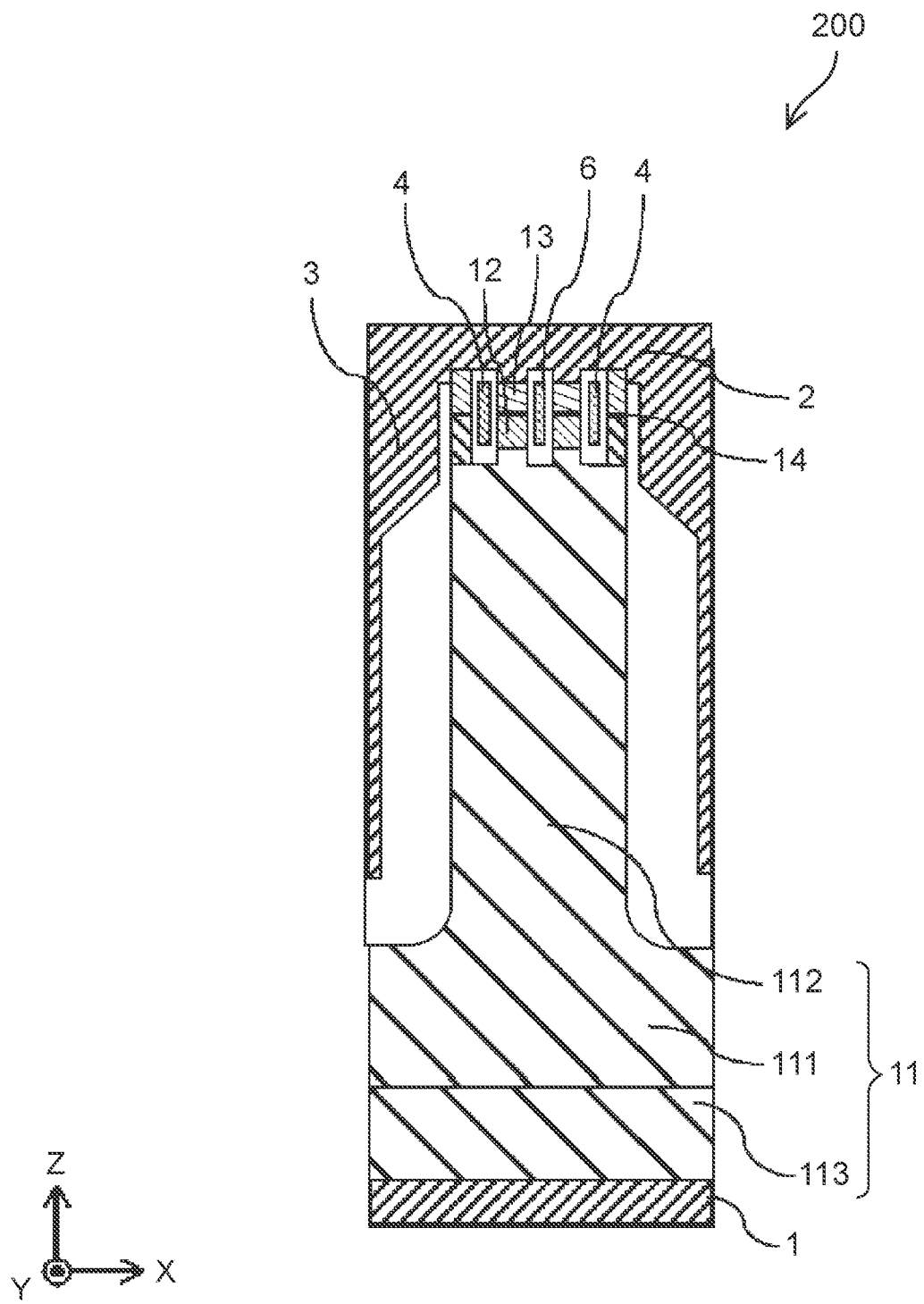
FIG. 3 is a schematic cross-sectional view of a semiconductor device according to a modification.

A modification of the embodiment will be described. FIG. 3 is a schematic cross-sectional view of a semiconductor device according to a modification. The same reference numerals as those in FIGS. 1 and 2 denote the same parts in the reference numerals in FIG. 3.

As illustrated in FIG. 3, in a semiconductor device 200 of the modification, a second gate electrode 6 is provided in a region between a second portion 112 and a second electrode 2. The second gate electrode 6 is located between two gate electrodes 4 adjacent to each other in the X direction, and is in contact with a second semiconductor region 12 and a third semiconductor region 13. A desired threshold value can be set by independently controlling a voltage applied to the gate electrode 4 and the second gate electrode 6.

According to the embodiment and the modifications thereof described above, it is possible to provide a semiconductor device that achieves both low gate capacitance and low on-resistance.

Although some embodiments of the present invention have been described, these embodiments are presented as examples and are not intended to limit the scope of the invention These novel embodiments can be implemented in various other forms, and various omissions, replacements, and changes can be made without departing from the spirit of the invention. The embodiments or modifications thereof are included in the scope of the invention described in the claims and the scope thereof as well as in the scope or gist of the description.

What is claimed is:
1. A semiconductor device, comprising:
a first electrode;
a second electrode;
a first semiconductor region of a first conductivity type that is located between the first electrode and the second electrode in a first direction from the first electrode toward the second electrode and has a first portion and a second portion,
the first portion being electrically connected to the first electrode and extending in a second direction intersecting the first direction,
the second portion being located between the first portion and the second electrode in the first direction;
a second semiconductor region of a second conductivity type that is located between the second portion and the second electrode;
a third semiconductor region of the first conductivity type that is electrically connected to the second electrode and located between the second semiconductor region and the second electrode in the first direction;
a fourth semiconductor region of the second conductivity type that is electrically connected to the second electrode and located between the second portion and the second electrode in the first direction;
a gate electrode that is located between the second portion and the second electrode in the first direction and located between the second semiconductor region and the fourth semiconductor region and between the third semiconductor region and the fourth semiconductor region in the second direction;

a first insulating region that electrically separates the gate electrode from the first to fourth semiconductor regions and the second electrode;

a third electrode that is located between the second electrode and the first portion in the first direction and electrically connected to the second electrode; and a second insulating region that is located between the third electrode and the first portion, the second portion, and the fourth semiconductor region, and is in contact with the fourth semiconductor region, wherein the third electrode faces the fourth semiconductor region, the first portion, and the second portion via the second insulating region.

2. The semiconductor device according to claim 1, wherein the fourth semiconductor region, the third electrode, and the gate electrode are each provided in plural, the two fourth semiconductor regions are located between the two adjacent third electrodes in the second direction, the plurality of gate electrodes is disposed between the two fourth semiconductor regions in the second direction, and the second semiconductor region and the third semiconductor region are located between the plurality of gate electrodes in the second direction.

3. The semiconductor device according to claim 1, wherein in the second direction, the gate electrode and the fourth semiconductor region are located between the second semiconductor region and the third electrode.

4. The semiconductor device according to claim 1, wherein the third electrode has a first electrode portion and a second electrode portion closer to the first electrode than the first electrode portion in the first direction, and a width of the second electrode portion in the second direction is smaller than that of the first electrode portion in the second direction.

5. The semiconductor device according to claim 1, wherein the first semiconductor region includes a third portion that is in contact with the first electrode and has a higher first conductivity type impurity concentration than the first portion.

6. The semiconductor device according to claim 1, wherein the fourth semiconductor region includes a fourth portion and a fifth portion that has a second conductivity type impurity concentration higher than that of the fourth portion and is electrically connected to the second electrode.

* * * * *